United States Patent
Lee et al.

(10) Patent No.: US 8,222,809 B2
(45) Date of Patent: Jul. 17, 2012

(54) FLAT PANEL DISPLAY APPARATUS

(75) Inventors: Keun-Soo Lee, Suwon-si (KR); Deuk-Jong Kim, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 1430 days.

(21) Appl. No.: 11/591,568

(22) Filed: Nov. 2, 2006

(65) Prior Publication Data

US 2007/0096633 A1    May 3, 2007

(30) Foreign Application Priority Data

Nov. 3, 2005   (KR) ................. 10-2005-0104922

(51) Int. Cl.
*H01J 1/62*       (2006.01)
*H01J 63/04*      (2006.01)
(52) U.S. Cl. ..................................................... 313/506
(58) Field of Classification Search ........... 313/498–512
See application file for complete search history.

(56) References Cited

U.S. PATENT DOCUMENTS

| | | | |
|---|---|---|---|
| 7,183,580 B2 | 2/2007 | Hayashi et al. | |
| 7,230,593 B2 | 6/2007 | Nakanishi | |
| 7,474,375 B2 | 1/2009 | Kwak et al. | |
| 2001/0048109 A1 | 12/2001 | Murade | |
| 2003/0094615 A1* | 5/2003 | Yamazaki et al. | 257/72 |
| 2005/0056840 A1 | 3/2005 | Yamazaki et al. | |
| 2005/0179374 A1* | 8/2005 | Kwak | 313/506 |
| 2005/0184927 A1* | 8/2005 | Kwak | 345/45 |
| 2005/0200270 A1* | 9/2005 | Kwak et al. | 313/502 |
| 2005/0218396 A1 | 10/2005 | Tsuchiya et al. | |
| 2005/0236629 A1 | 10/2005 | Lee et al. | |

FOREIGN PATENT DOCUMENTS

| | | |
|---|---|---|
| CN | 1 658 726 A | 8/2005 |
| JP | 02-039030 A | 2/1990 |
| JP | 2002-244589 A | 8/2002 |
| JP | 2003-271075 A | 9/2003 |
| JP | 2004-102246 A | 4/2004 |
| JP | 2005-251721 A | 9/2005 |
| JP | 2005-258395 A | 9/2005 |
| JP | 2005-258405 A | 9/2005 |
| JP | 2005-302707 A | 10/2005 |
| KR | 10-2005-0081540 | 8/2005 |

* cited by examiner

*Primary Examiner* — Toan Ton
*Assistant Examiner* — Zachary Snyder
(74) *Attorney, Agent, or Firm* — Lee & Morse, P.C.

(57) ABSTRACT

A flat panel display apparatus, including a substrate, a display unit disposed on the substrate, a first interconnecting line positioned on the substrate at an outer side of the display unit, a second interconnecting line located above the first interconnecting line, and at least two insulating layers interposed between the first and second interconnecting lines.

20 Claims, 7 Drawing Sheets

FLAT PANEL DISPLAY APPARATUS

BACKGROUND OF THE INVENTION

1. Field of the Invention

The present invention relates to a flat panel display apparatus. In particular, the present invention relates to a flat panel display apparatus having a structure minimizing potential short circuits between the outer interconnecting lines of its display unit.

2. Description of the Related Art

In general, a flat panel display apparatus may include a thin, light display unit, such as an organic light emitting display unit, a liquid crystal display unit, a plasma display unit, and so forth. A flat panel display apparatus may include a display unit positioned between a substrate and a sealing substrate, first and second interconnecting lines on an outer side of the display unit, and an insulating layer between the first and second interconnecting lines to protect at least one thin film transistor (TFT).

In the conventional flat panel display apparatus, only a single insulating layer is disposed between the first and second interconnecting lines. Therefore, if the insulating layer is defective, a short circuit may occur between the first and second interconnecting lines. In particular, when the sealing substrate is coupled to the substrate along its edges by way of a sealant, the first interconnecting line may be pressed towards the second interconnecting line, thereby causing a short circuit therebetween, as illustrated in FIGS. 1-2.

Accordingly, there exists a need to provide a flat panel display apparatus having a structure providing minimized short circuits between its interconnecting lines.

SUMMARY OF THE INVENTION

The present invention is therefore directed to a flat panel display apparatus, which substantially overcomes one or more of the disadvantages of the related art.

It is therefore a feature of an embodiment of the present invention to provide a flat panel display apparatus having an improved structure to minimize short circuits between its interconnecting lines.

At least one of the above and other features and advantages of the present invention may be realized by providing a flat panel display apparatus, including a substrate, a display unit disposed on the substrate, a first interconnecting line positioned on the substrate at an outer side of the display unit, a second interconnecting line located above the first interconnecting line, and at least two insulating layers interposed between the first and second interconnecting lines. At least one of the two insulating layers interposed between the first and second interconnecting lines may be formed of an inorganic material.

The flat panel display apparatus of the present invention may further include at least one thin film transistor (TFT) having a source electrode, a drain electrode, and a gate electrode, wherein the gate electrode may be positioned on the substrate below the source and drain electrodes. The first interconnecting line may be formed of the same material as the gate electrode.

The flat panel display apparatus of the present invention may also include an inter-insulating film positioned between the gate electrode and the source and drain electrodes. The inter-insulating film may be one of the at least two insulating layers interposed between the first and second interconnecting lines.

The flat panel display apparatus of the present invention may further include a protection film positioned between the inter-insulating film and the second interconnecting line. The protection film may be one of the at least two insulating layers interposed between the first and second interconnecting lines. The protection film may be a discontinuous layer.

Additionally, the flat panel display apparatus of the present invention may include a first electrode electrically connected to at least one of the source and drain electrodes through a contact hole in the protection film, wherein the first electrode may be formed of the same material as the second interconnecting line. The flat panel display apparatus may also include a second electrode electrically connected to the second interconnecting line.

The flat panel display apparatus of the present invention may further include a third interconnecting line attached onto an upper surface of the inter-insulating film and electrically connected to the second interconnecting line through a contact hole in the inter-insulating film. Also, the apparatus may include a sealant positioned at an outer side of the display unit on the second interconnecting line, wherein the sealant may include spacers.

The display unit of the flat panel display apparatus according to an embodiment of the present invention may be an organic light emitting display unit.

In another aspect of the present invention, there is provided an organic light emitting display apparatus, including an organic light emitting display unit disposed on a substrate, a first interconnecting line and at least one gate electrode positioned on the substrate, an inter-insulating film applied onto an upper surface of the first interconnecting line and the at least one gate electrode, at least one source electrode and at least one drain electrode attached onto the inter-insulating film, a protection film applied onto an upper surface of the at least one source electrode and at least one drain electrode, a second interconnecting line and a first electrode positioned on the protection film, a pixel defining layer disposed on the protection film, a second electrode electrically connected to the second interconnecting line, and an intermediate layer having at least one light emitting layer positioned between the first and second electrodes.

The organic light emitting display apparatus according to an embodiment of the present invention may also include a conductive layer attached onto the inter-insulating film between the display unit and the first interconnecting line.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
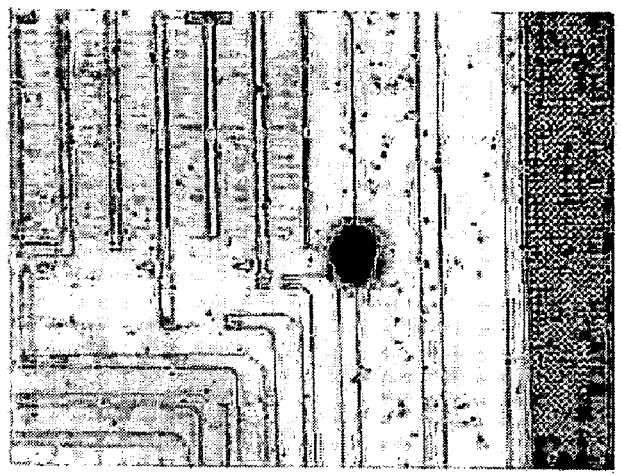
FIG. 1 illustrates a photograph of a short circuit between the first and second interconnecting lines of a conventional flat panel display apparatus.
Figure 2:
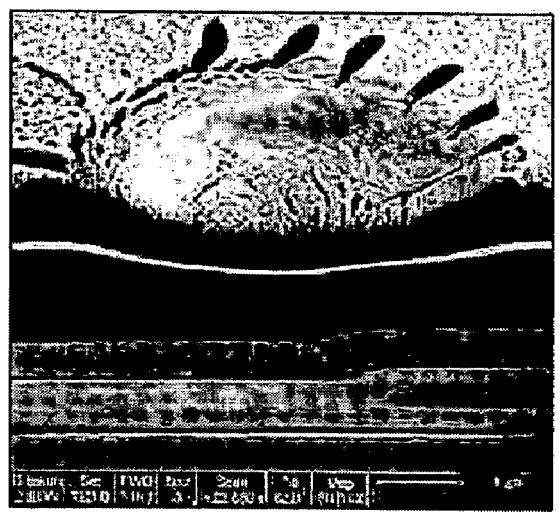
FIG. 2 illustrates a photograph of the cross-section of the short circuit illustrated in FIG. 1.

Korean Patent Application No. 10-2005-0104922, filed on Nov. 3, 2005, in the Korean Intellectual Property Office, and entitled: "Flat Panel Display Apparatus," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of elements and regions may be exaggerated for clarity of illustration. It will also be understood that when an element is referred to as being "on" another element or substrate, it can be directly on the other element or substrate, or intervening elements may also be present. Further, it will be understood that when an element is referred to as being "under" another element, it can be directly under, or one or more intervening elements may also be present. In addition, it will also be understood that when an element is referred to as being "between" two elements, it can be the only element between the two elements, or one or more intervening elements may also be present. Like reference numerals refer to like elements throughout.

An exemplary embodiment of a flat panel display apparatus according to the present invention is more fully described below with reference to FIGS. 3-4.

Figure 3:
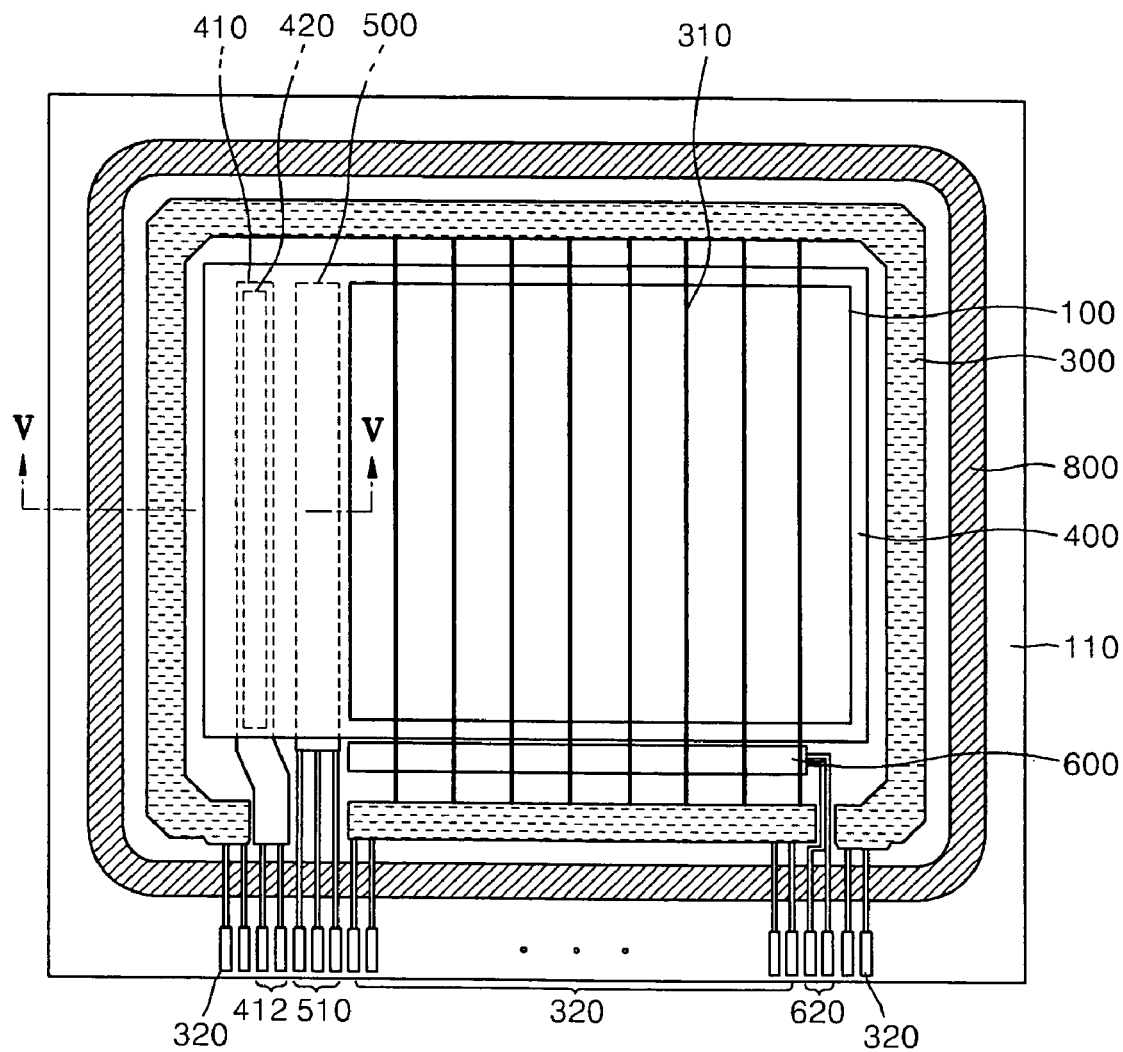
FIG. 3 illustrates a plan view of a flat panel display apparatus according to an embodiment of the present invention.

As illustrated in FIGS. 3-4, a flat panel display apparatus according to an embodiment of the present invention may include a display unit 100 positioned on a substrate 110 made of glass, metal, or plastic, first and second interconnection lines 410 and 420, and a sealing substrate 900.

The display unit 100 may be a flat panel display unit, e.g., an organic light emitting display, having a first electrode 210, a second electrode 400 opposite the first electrode 210, an intermediate layer 230 including at least one organic light emitting layer positioned between the first and second electrodes 210 and 400, and a plurality of thin film transistors (TFTs).

The first electrode 210 of the display unit 100 may be a transparent electrode or a reflective electrode. If the first electrode 210 is a transparent electrode, it may be formed of any one of indium tin oxide (ITO), indium zinc oxide (IZO), zinc oxide (ZnO), or indium oxide ($In_2O_3$). If the first electrode layer 210 is a reflective electrode, it may be formed of any one of indium tin oxide (ITO), indium zinc oxide (IZO), zinc oxide (ZnO), or indium oxide ($In_2O_3$) deposited on a reflection film made of silver (Ag), magnesium (Mg), aluminum (Al), platinum (Pt), palladium (Pd), gold (Au), nickel (Ni), neodymium (Nd), iridium (Ir), chromium (Cr), or a like metal.

The second electrode 400 of the display unit 100 may also be either a transparent electrode or a reflective electrode, and it may operate as a cathode. Accordingly, if the second electrode 400 is a transparent electrode, it may be formed of an auxiliary electrode layer or a bus electrode line deposited onto a metal material having a low work function. For example, the auxiliary electrode layer or the bus electrode line may be formed of any one of indium tin oxide (ITO), indium zinc oxide (IZO), zinc oxide (ZnO), or indium oxide ($In_2O_3$), and the metal material having a low work function may be any one of lithium (Li), calcium (Ca), lithium-fluoride-calcium (LiF/Ca), lithium-fluoride-aluminum (LiF/Al), silver (Ag), magnesium (Mg), aluminum (Al), or a like metal material. If the second electrode layer 400 is a reflective electrode, it may be formed of a layer of lithium (Li), calcium (Ca), lithium-fluoride-calcium (LiF/Ca), lithium-fluoride-aluminum (LiF/Al), silver (Ag), magnesium (Mg), aluminum (Al), or a like metal material. However, it should be noted that other materials for forming the first and second electrodes 210 and 400 are not excluded from the scope of the present invention. For example, the first electrode 210 and the second electrode 400 may be formed of an organic material, e.g., a conductive polymer.

The intermediate layer 230 of the display unit 100 may include at least one organic light emitting layer made of any known type of organic or inorganic light-emitting material known in the art, e.g., low-molecular weight organic material, polymeric organic material, and so forth. If the intermediate layer 230 is made of a low-molecular weight organic material, it may be formed of any one of copper phthalocyanine (CuPc), N,N'-di(naphthalene-1-yl)-N,N'-diphenyl-benzidine (NPB), tris-8-hydroxyquinoline aluminum (Alq3), or a like material by any method known in the art, such as an evaporation method. The intermediate layer 230 may be formed to have a single or a composite structure having at least one of a hole injection layer (HIL), a hole transport layer (HTL), an emission layer (EML), an electron transport layer (ETL), and an electron injection layer (EIL). If the intermediate layer 230 is formed of a polymeric organic material, it may be formed to have a structure including an HTL and an EML way of screen printing or ink jet printing. The HTL may be formed of poly-(2,4)-ethylene-dihydroxy thiophene (PEDOT), and the EML may be formed of Poly-Phenylenevinylene (PPV) or Polyfluorene polymer organic material.

The plurality of TFTs of the display unit 100 may be positioned on the substrate 110 in a configuration determined according to one of ordinary skill in the art. For example, the TFTs may be located in a vertical circuit driving unit 500 and/or a horizontal circuit driving unit 600, as illustrated in FIG. 3. Each TFT may include a gate electrode 150 and source and drain electrodes 170, as illustrated in FIG. 4A.

Figure 4A:
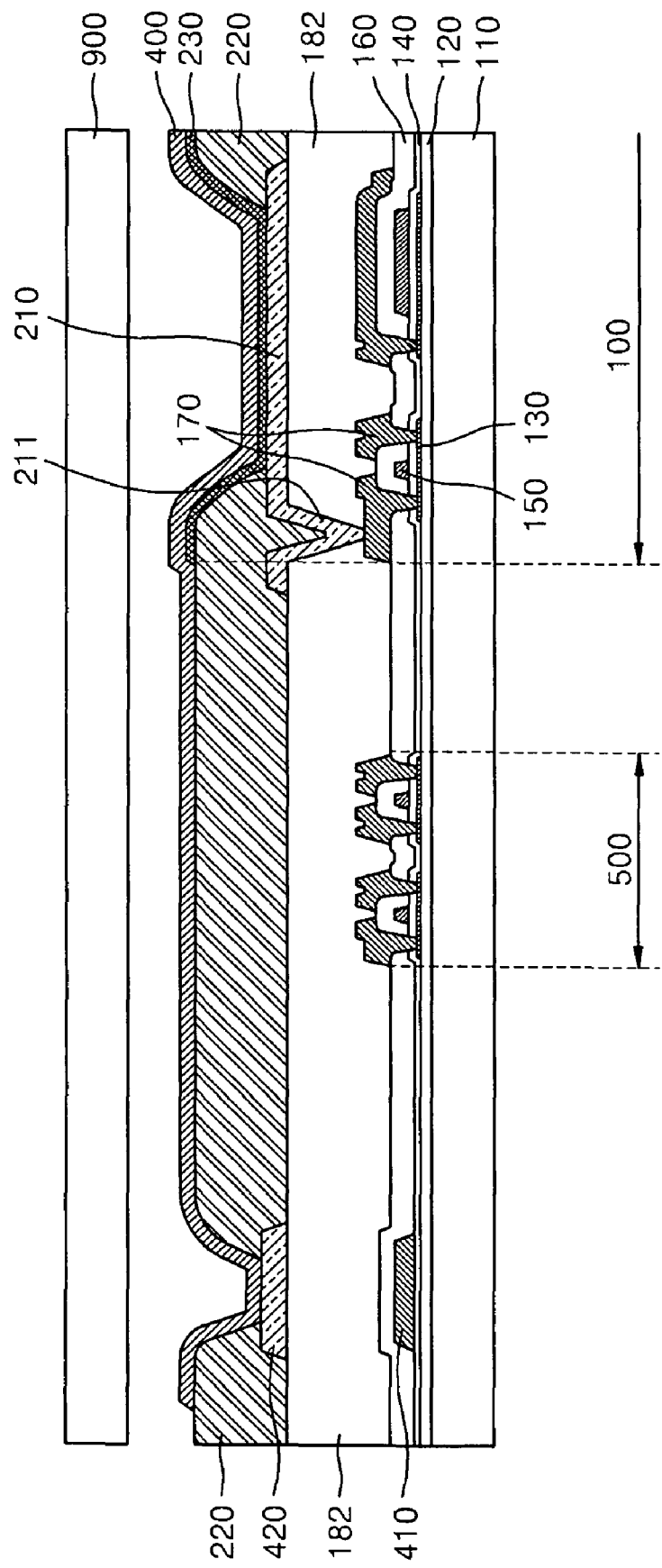
FIG. 4A illustrates a cross-sectional view taken along line V-V illustrated in FIG. 3.

As further illustrated in FIG. 4A, the flat panel display apparatus according to an embodiment of the present invention may further include a plurality of functional layers. A buffer layer 120 may be formed of $SiO_2$ and deposited onto the substrate 110, a semiconductor layer 130 and a gate insulating layer 140 may be disposed between the substrate 110 and the TFTs, and an inter-insulating film 160 and a protection film 182 may be employed as insulation layers.

The semiconductor layer 130 may be deposited on the substrate 110, and it may be formed of any material known in the art. Preferably, the semiconductor layer 130 may be formed of amorphous silicon, polycrystalline silicon, or an organic semiconductor material. The semiconductor layer 130 may include source and drain regions doped with an N-type or a P-type dopant and a channel region.

The gate insulating layer 140 may be formed of $SiO_2$ by plasma enhanced chemical vapor deposition between the semiconductor layer 130 and the gate electrode 150 in order to insulate the semiconductor layer 130 from the gate electrode 150.

The gate electrode 150 may be deposited above the semiconductor layer 130 with the gate insulating layer 140 therebetween. The gate electrode 150 may be formed of a single layer or multiple layers of conductive materials, such as molybdenum tungsten (MoW), aluminum copper (Al/Cu), and so forth.

The inter-insulating film 160 may be formed of any one of silicon oxide (SiO2), silicon nitride (SiNx), and so forth, and it may be deposited on an upper part of the gate electrode 150 in a single layer or multiple layers.

The source and drain electrodes 170 may be deposited on an upper surface of the inter-insulating film 160. Each of the source and drain electrodes 170 may be electrically connected to each other according to signals applied to the gate electrode 150. Further, each of the source and drain electrodes 170 may be electrically connected to the semiconductor layer 130 through contact holes formed in the gate insulating layer 140 and the inter-insulating film 160.

The protection film 182 may be a passivation layer and/or a planarizing layer formed above the source and drain electrodes 170 to protect or planarize the TFTs. The protection film 182 may be formed of a single layer or of a composite layer made of organic and inorganic materials. The protection film 182 may be formed of any suitable material known in the art, including organic materials such as benzocyclobutene (BCB), acryl, and so forth, or inorganic materials, such as SiNx. Further, the protection film 182 may be applied above the substrate 110, such that it may continuously and uniformly coat a surface of the substrate 110 and any components thereon. The first electrode 210 of the display unit 100 may be positioned on the protection film 182, and it may be electrically connected to the source and drain electrodes 170 through a contact hole formed in the protection film 182.

The first and second interconnecting lines 410 and 420 of the flat panel display apparatus according to an embodiment of the present invention may be formed on an outer side of the display unit 100 in order to transmit electrical signals, as will be discussed in detail below.

The first interconnecting line 410 may operate as a power supply line. For example, the first interconnecting line 410 may be electrically connected, directly or indirectly, to the vertical circuit driving unit 500 via a terminal unit 510 in order to transmit electrical signals. Additionally, the first interconnecting line 410 may supply power to other parts of the flat panel display apparatus. For example, the first interconnecting line 410 may supplement power to a driving power wiring unit 300, such that sufficient power may be transmitted from the driving power wiring unit 300 to a plurality of driving lines (VDD) 310 included in the display unit 100.

The second interconnecting line 420 may be electrically connected to the second electrode 400 of the display unit 100 in order to supply power thereto. However, it should be noted that other power lines in communication with the display unit 100, in addition to the second interconnecting line 420, are not excluded from the scope of the present invention. For example, as previously mentioned with respect to the first interconnecting line 410, the plurality of driving lines (VDD) 310 may be connected to a terminal 320 via the driving power wiring unit 300 to supply driving power to the display unit 100. In this respect, it should be noted that the driving power wiring unit 300 may have any convenient shape as determined by one skilled in the art, and its shape may not be limited to the configuration illustrated in FIG. 3, i.e., a shape surrounding the display unit 100.

The first interconnecting line 410 may be disposed on the same level as the gate electrode 150. In other words, both the first interconnecting line 410 and the gate electrode 150 may be applied to the same layer, e.g., positioned between the gate insulating layer 140 and the inter-insulating layer 160. Accordingly, the first interconnecting line 410 and the gate electrode 150 may be formed simultaneously on the gate insulating layer 140. Further, the first interconnecting line 410 and the gate electrode 150 may be formed of the same material or a different material as determined by one of ordinary skill in the art.

The second interconnecting line 420 may be disposed on the same level as the first electrode 210. In other words, both the second interconnecting line 420 and the first electrode 210 may be positioned on the same layer, e.g., on the protection film 182. Accordingly, the second interconnecting line 420 and the first electrode 210 may be formed simultaneously on the protection film 182. Further, the second interconnecting line 420 and the first electrode 210 may be formed of the same material or a different material as determined by one of ordinary skill in the art.

The first and second interconnecting lines 410 and 420 may be positioned such that at least two insulating layers may be interposed therebetween. For example, the inter-insulating film 160 and the protection film 182 may be deposited between the first and second interconnecting lines 410 and 420, as illustrated in FIG. 4A, thereby preventing a potential short circuit between the first and second interconnecting lines 410 and 420.

When two insulating layers are deposited between the first and second interconnecting lines 410 and 420, at least one of the two insulating layers may be formed of an inorganic material. In particular, since the protection film 182 may be conventionally formed of an organic material that has low resistance to external pressure, thereby facilitating short circuits, the inter-insulating film 160 may be formed of an inorganic material that is capable of resisting external pressure.

It should be noted, however, that deposition of additional insulating layers between the first and second interconnecting lines 410 and 420 is not excluded from the scope of the present invention.

Figure 4B:
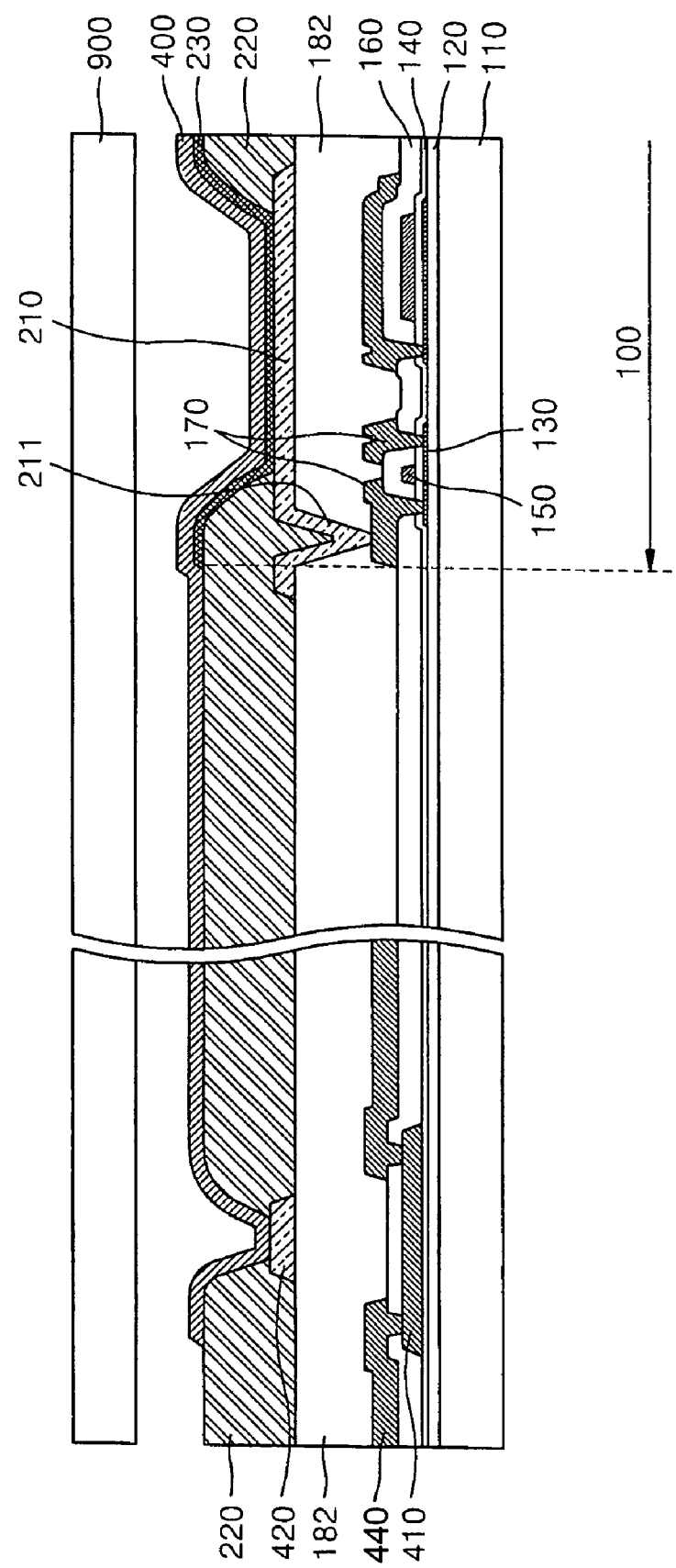
FIG. 4B illustrates a cross-sectional view of a flat panel display apparatus according to another embodiment of the present invention.

Additionally, in accordance with another embodiment of the present invention illustrated in FIG. 4B, a third interconnecting line 440 may be included in the flat display apparatus of the present invention. In particular, the third interconnecting line 440 may be disposed on the same level as the source and drain electrodes 170, and it may be electrically connected to the first interconnecting line 410 through a contact hole formed in the inter-insulating film 160. In other words, in order to avoid the cross of the third interconnecting line 440 and the second interconnecting line 420 with only one insulating layer interposed therebetween, not the third interconnecting line 440 but the first interconnecting line 410 is formed under the second interconnecting line 420, and the third interconnecting line 440 is electrically connected to the first interconnecting line 410. In this way, it is possible to minimize the potential for a short circuit between the second interconnecting line 420 and neighboring interconnecting lines.

The flat panel display apparatus according to an embodiment of the present invention may further include a pixel defining layer 220. The pixel defining layer 220 may be partially positioned in the display unit 100 between the ends of the first and second electrodes 210 and 400 and partially outside the display unit 100 on an upper surface of the protection film 182 and the second interconnecting line 420, as illustrated in FIGS. 4A and 4B. In particular, the pixel defining layer 220 may include an opening to expose the first electrode 210 to define a pixel. The pixel defining layer 220 may increase the distance between the end of the first electrode 210 and the second electrode 400 to prevent arcing at the end of the first electrode 210. The pixel defining layer 220 may include a contact hole exposing at least a portion of the second interconnecting line 420 to facilitate electrical contact between the second interconnecting line 420 and the second electrode 400.

The flat panel display apparatus according to an embodiment of the present invention may also include terminals 412 and 620 located on an outer edge of the substrate 110 as illustrated in FIG. 3. The terminals 320, 412, 510, and 620 may be electrically connected to a driving power line unit 300, the first interconnecting line 410, the vertical circuit driving unit 500, and the horizontal circuit driving unit 600.

The flat panel display apparatus according to an embodiment of the present invention may also include a sealing member 800 located on an outer edge of the substrate 110 to seal the substrate 110 with the sealing substrate 900.

Figure 5:
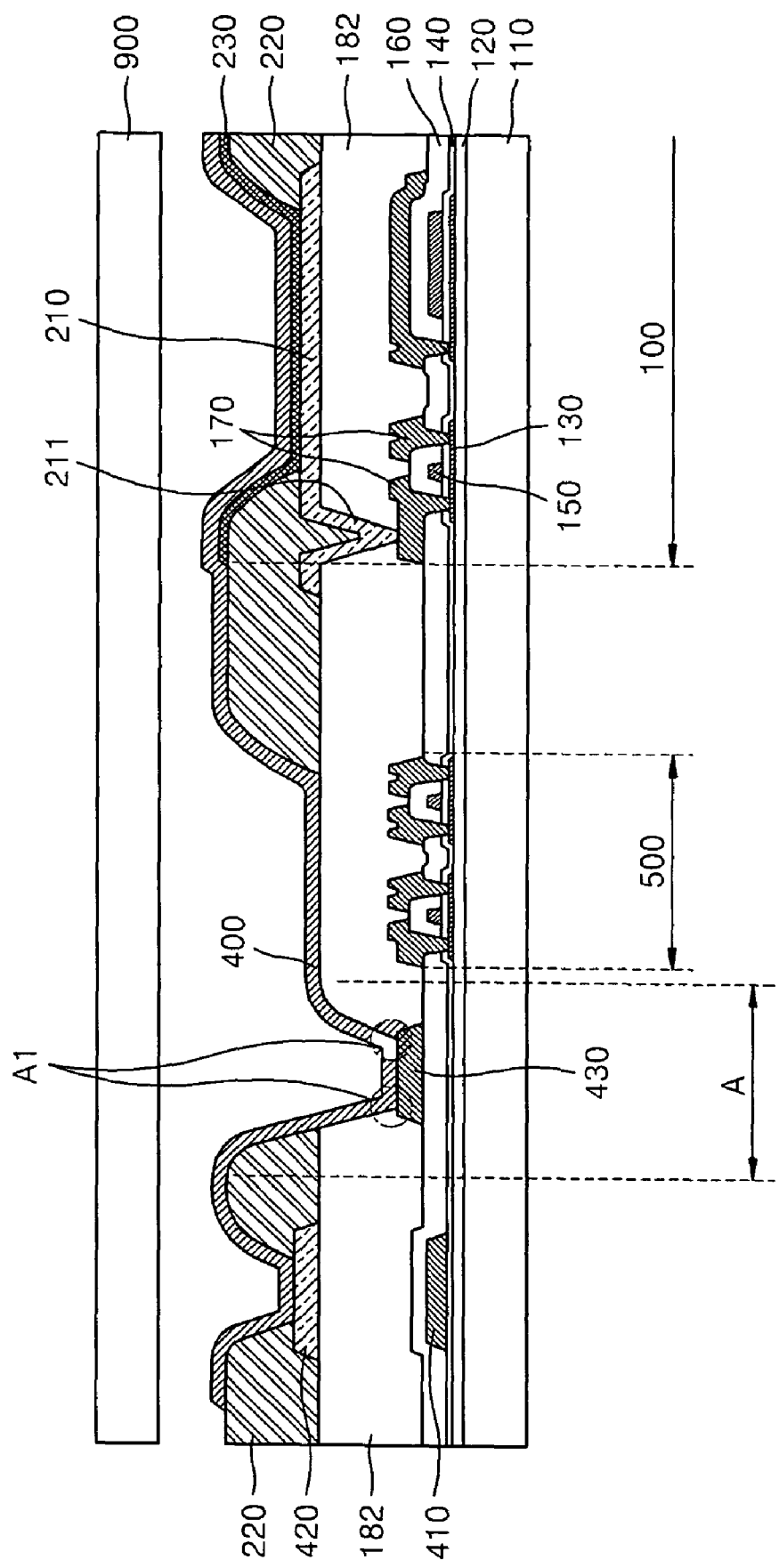
FIG. 5 illustrates a cross-sectional view of a flat panel display apparatus according to another embodiment of the present invention.

In another embodiment of the present invention illustrated in FIG. 5, the flat panel display apparatus of the present invention may be configured to have discontinuous layers of the protection film 182 and the pixel defining layer 220. The protection film 182 and the pixel defining layer 220 may have gaps between the display unit 100 and the first and second interconnecting lines 410 and 420, as opposed to the structure described with respect to FIG. 4A. In this respect, it should be noted that the particular elements included in the embodiment illustrated in FIG. 5 are the same elements described previously with respect to the flat panel display apparatus illustrated in FIGS. 3-4. Accordingly, only details that may be distinguishable from the previous embodiment will be described hereinafter. Details and descriptions that may be found in both embodiments of the flat panel display apparatus illustrated in FIGS. 3-5 will not be repeated herein.

In accordance with the embodiment illustrated in FIG. 5, the protection film 182 may be applied discontinuously to the substrate 110. In particular, the protection film 182 may have at least one gap therein, i.e., region A, between the first and second interconnecting lines 410 and 420 and the display region 100. Without intending to be bound by theory, it is believed that when the protection film 182 includes a multiple-layer composite configuration, such a discontinuous structure thereof may minimize impurities penetration between the multiple layers, thereby minimizing the degradation of the display unit 100 and prolonging its lifespan. In this respect, it should be noted that a "discontinuous" layer or film refers to a layer having at least one gap therein.

As further illustrated in FIG. 5, the flat panel display apparatus according to an embodiment of the present invention may also include a conductive layer 430 between the first and second interconnecting lines 410 and 420 and the display unit 100. Without intending to be bound by theory, it is believed that the conductive layer 430 may prevent discontinuity of the second electrode 400 at a portion A1 due to the discontinuity of the protection film 182, as illustrated in FIG. 5. Further, even if the second electrode 400 is not in direct electrical communication with the second interconnecting line 420, it is believed that the second electrode 400 and the second interconnecting line 420 may be electrically connected via the conductive layer 430, thereby preventing malfunction of the apparatus.

The conductive layer 430 may be disposed on the same level as the source and drain electrodes 170, i.e., both the conductive layer 430 and the source and drain electrodes 170 may be positioned on the inter-insulating film 160. Accordingly, the conductive layer 430 and the source and drain electrodes 170 may be formed simultaneously on the inter-insulating film 160. Further, the conductive layer 430 and the source and drain electrodes 170 may be formed of the same material or of a different material as determined by one of ordinary skill in the art.

In accordance with the embodiment illustrated in FIG. 5, at least two insulating layers, e.g., the inter-insulating film 160 and the protection film 182, may be disposed between the first and second interconnecting lines 410 and 420 to minimize a potential for short circuit between the first and second interconnecting lines 410 and 420.

Figure 6A:
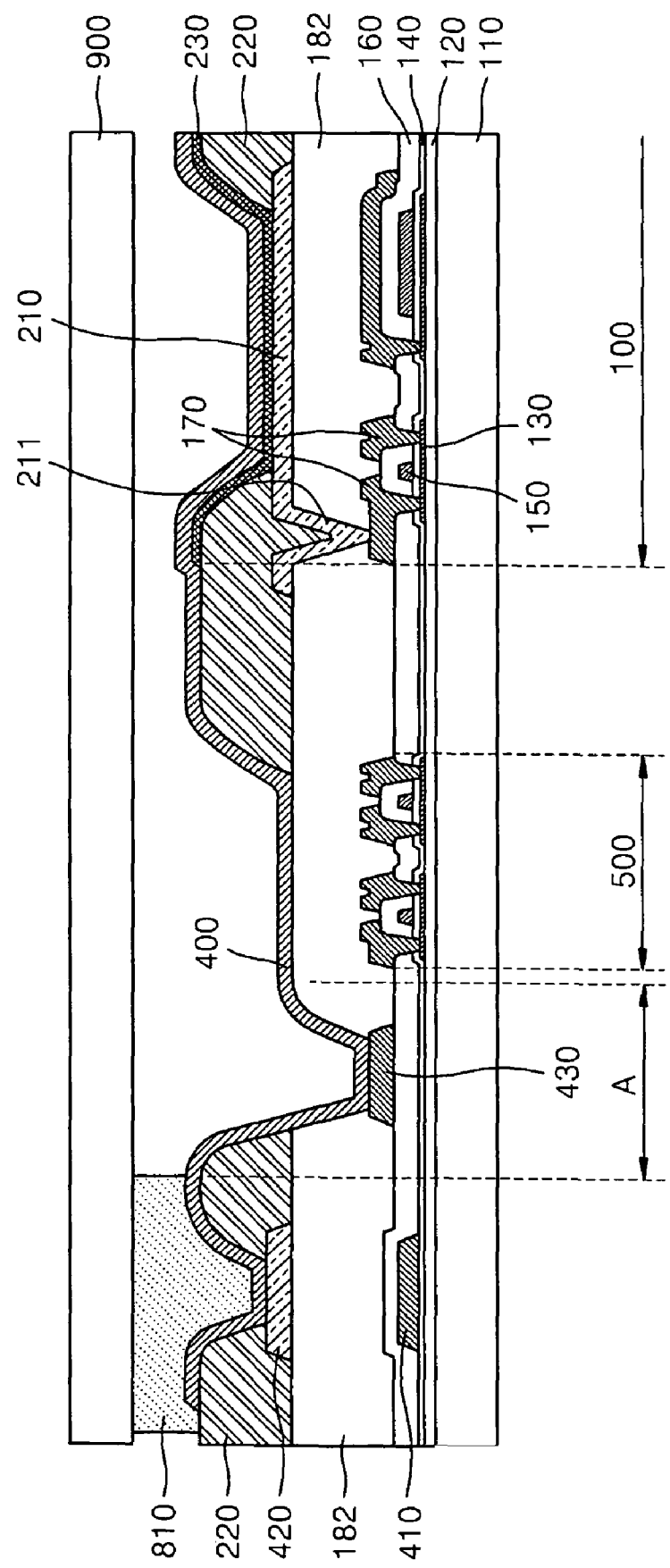
FIG. 6A illustrates a cross-sectional view of a flat panel display apparatus according to another embodiment of the present invention.

As illustrated in FIG. 6A, the flat panel display apparatus according to an embodiment of the present invention described previously with respect to FIG. 5 may also include a sealant 810.

Figure 6B:
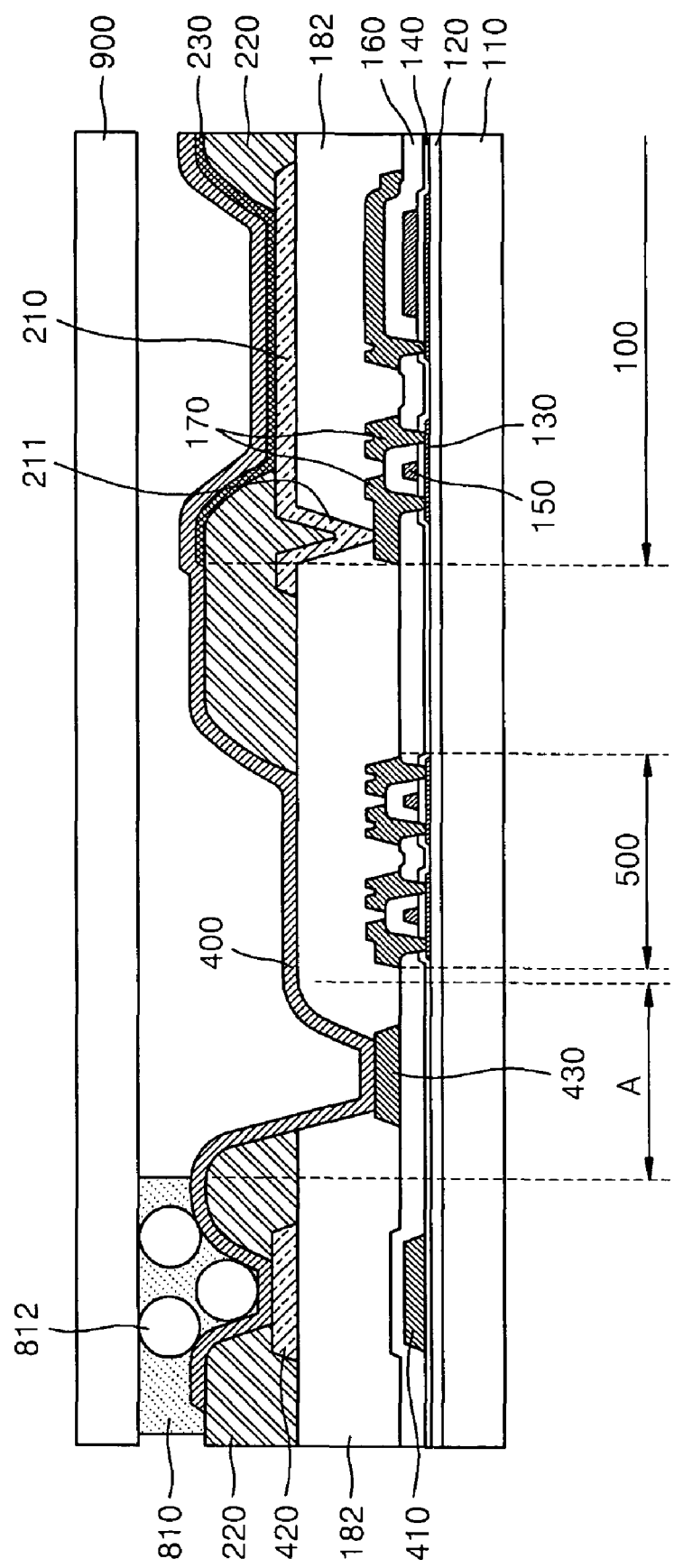
FIG. 6B illustrates a cross-sectional view of a flat panel display apparatus according to another embodiment of the present invention.

The sealant 810 may be formed above the second interconnecting line 420, i.e., the sealant 810 may be formed outside the display unit 100 between the second interconnecting line 420 and the sealing substrate 900. Further, the sealant 810 may include spacers 812 therein, as illustrated in FIG. 6B. Without intending to be bound by theory, it is believed that formation of the sealant 810 on an outer portion of the second interconnecting line 420 may reduce the size of an area outside the display unit 100, thereby reducing the size of the display panel, while maintaining the size of the display unit 100.

In accordance with the embodiment illustrated in FIGS. 6A and 6B, at least two insulating layers, e.g., the inter-insulating film 160 and the protection film 182, may be disposed between the first and second interconnecting lines 410 and 420 to minimize a potential short circuit between the first and second interconnecting lines 410 and 420. Further, without intending to be bound by theory, it is believed that employing at least two insulating layers in the embodiment illustrated in FIG. 6B is advantageous to further minimize manufacturing defects, e.g., short circuits between the first and second interconnecting lines 410 and 420 due to the compression of the second interconnecting line 420 during sealing of the substrate 110 and the sealing substrate 900, caused due to spacers 812 that may be located in the sealant 810.

The flat panel display apparatus according to an embodiment of the present invention may be any flat panel display apparatus known in the art, such as an organic light emitting display apparatus, liquid crystal display apparatus, and so forth.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:
1. A flat panel display apparatus, comprising:
  a substrate;
  a display unit disposed on the substrate including at least one source electrode and at least one drain electrode;
  a first interconnecting line positioned on the substrate at an outer side of the display unit, the first interconnecting line transmitting electrical signals or power supply therethrough and being electrically connected to the display unit;
  a second interconnecting line located above the first interconnecting line; and
  at least two insulating layers interposed between the first and second interconnecting lines, the at least two insulating layers including:

a first insulating layer overlapping an upper surface of the first interconnecting line, the at least one source electrode and at least one drain electrode being attached to at least an upper surface of the first insulating layer, and the first interconnecting line being completely embedded under the first insulating layer at the outer side of the display unit, and a second insulating layer overlapping upper surfaces of the at least one source electrode and the at least one drain electrode.

2. The flat panel display apparatus as claimed in claim 1, wherein the at least one source electrode and the at least one drain electrode have at least one gate electrode positioned on the substrate below respective source and drain electrodes.

3. The flat panel display apparatus as claimed in claim 2, wherein the upper surface of first interconnecting line is formed of the same material as the gate electrode, and only the first and second insulating layers are disposed between the upper surface of the first interconnecting line and an opposing lower surface of the second interconnecting line.

4. The flat panel display apparatus as claimed in claim 2, wherein the first insulating layer is interposed between the at least one gate electrode and the at least one source and drain electrodes.

5. The flat panel display apparatus as claimed in claim 1, wherein the first insulating layer is an inter-insulating film that covers the upper surface of the first interconnecting line and that includes one of silicon oxide or silicon nitride, the upper surface of the first interconnecting line being an upper-most surface of the first interconnecting line.

6. The flat panel display apparatus as claimed in claim 5, wherein the second insulating layer is a protection film positioned between the inter-insulating film and a lower-most surface of the second interconnecting line, the second insulating layer including at least one organic material and at least one inorganic material, and the upper-most surface of the first interconnecting line and the lower-most surface of the second interconnecting line are spaced apart by the inter-insulating film and the protection film.

7. The flat panel display apparatus as claimed in claim 1, wherein the second insulating layer is a discontinuous layer between a circuit driving unit of the display unit and the outer side of the display unit including the first and second interconnecting lines.

8. The flat panel display apparatus as claimed in claim 6, further comprising a first electrode electrically connected to at least one of the at least one source electrode and the at least one drain electrode through a contact hole in the protection film.

9. The flat panel display apparatus as claimed in claim 8, wherein the first electrode is formed of the same material as the lower-most surface of the second interconnecting line.

10. The flat panel display apparatus as claimed in claim 8, further comprising a second electrode electrically connected to the second interconnecting line.

11. The flat panel display apparatus as claimed in claim 1, wherein at least one of the two insulating layers interposed between the first and second interconnecting lines is formed of an inorganic material.

12. The flat panel display apparatus as claimed in claim 4, further comprising a third interconnecting line attached to an upper surface of the first insulating layer and electrically connected to the first interconnecting line through a contact hole in the first insulating layer.

13. The flat panel display apparatus as claimed in claim 1, further comprising a sealant positioned at an outer side of the display unit on the second interconnecting line.

14. The flat panel display apparatus as claimed in claim 13, wherein the sealant includes spacers.

15. The flat panel display apparatus as claimed in claim 1, wherein the display unit is an organic light emitting display unit.

16. An organic light emitting display apparatus, comprising:
    a light emitting display unit disposed on a substrate;
    a first interconnecting line and at least one gate electrode positioned on the substrate, the first interconnecting line transmitting electrical signals or power supply therethrough and being electrically connected to the light emitting display unit and being positioned on an area of the substrate adjacent to the at least one gate electrode;
    an inter-insulating film overlapping upper surfaces of the first interconnecting line and the at least one gate electrode, the first interconnecting line being completely embedded under the inter-insulating film on the area of the substrate adjacent to the at least one gate electrode;
    at least one source electrode and at least one drain electrode attached to at least an upper surface of the inter-insulating film;
    a protection film overlapping upper surfaces of the at least one source electrode and the at least one drain electrode;
    a second interconnecting line and a first electrode positioned on the protection film;
    a pixel defining layer disposed on the protection film;
    a second electrode electrically connected to the second interconnecting line; and
    an intermediate layer having at least one light emitting layer positioned between the first and second electrodes.

17. The organic light emitting display apparatus as claimed in claim 16, further comprising a conductive layer attached to the inter-insulating film between the light emitting display unit and the first interconnecting line, the protection film being a discontinuous layer in a region including the conductive layer.

18. The organic light emitting display apparatus as claimed in claim 16, further comprising a gate insulating layer on the substrate below lower-most surfaces of the first interconnecting line and the at least one gate electrode, the gate insulating layer being in direct contact with the inter-insulating film in an area surrounding the lower-most surface of the first interconnecting line.

19. The flat panel display apparatus as claimed in claim 1, further comprising a gate insulating layer on the substrate below a lower-most surface of the first interconnecting line, the gate insulating layer being in direct contact with the first insulating layer in an area surrounding the lower-most surface of the first interconnecting line.

20. The flat panel display apparatus as claimed in claim 1, wherein the second interconnecting line transmits electrical signals or power supply therethrough and is electrically connected to the display unit.

* * * * *